(12) United States Patent
Celaya et al.

(10) Patent No.: US 7,180,170 B2
(45) Date of Patent: Feb. 20, 2007

(54) LEAD-FREE INTEGRATED CIRCUIT PACKAGE STRUCTURE

(75) Inventors: Phillip C. Celaya, Gilbert, AZ (US); James S. Donley, Gilbert, AZ (US); Stephen C. St. Germain, Scottsdale, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 11/040,334

(22) Filed: Jan. 24, 2005

(65) Prior Publication Data

US 2005/0121767 A1    Jun. 9, 2005

Related U.S. Application Data

(62) Division of application No. 09/817,330, filed on Mar. 26, 2001, now Pat. No. 6,889,429.

(51) Int. Cl.
*H01L 23/48* (2006.01)
*H01P 12/04* (2006.01)
*H05K 1/11* (2006.01)

(52) U.S. Cl. .............................. 257/698; 257/E23.004; 257/E23.067; 257/E23.068; 257/E23.069; 257/E25.013; 257/774; 257/773; 257/680; 257/786; 257/784; 257/691; 257/692; 257/693

(58) Field of Classification Search ........ 257/E23.067, 257/E23.068, E23.069, E23.004, E25.013, 257/774, 773, 698, 784, 690–693, 680, 786, 257/675, 676, 712, 713, 717, 720, 734, 737, 257/738

See application file for complete search history.

(56) References Cited

U.S. PATENT DOCUMENTS

| | | | | |
|---|---|---|---|---|
| 5,098,864 A | * | 3/1992 | Mahulikar | 29/837 |
| 5,672,542 A | * | 9/1997 | Schwiebert et al. | 438/4 |
| 5,808,873 A | * | 9/1998 | Celaya et al. | 361/760 |
| 5,895,229 A | * | 4/1999 | Carney et al. | 438/106 |
| 6,046,499 A | * | 4/2000 | Yano et al. | 257/712 |
| 6,097,089 A | * | 8/2000 | Gaku et al. | 257/712 |
| 6,153,518 A | * | 11/2000 | Abbott et al. | 438/672 |
| 6,162,664 A | * | 12/2000 | Kim | 438/126 |
| 6,249,053 B1 | * | 6/2001 | Nakata et al. | 257/738 |
| 6,262,477 B1 | * | 7/2001 | Mahulikar et al. | 257/698 |
| 6,462,421 B1 | * | 10/2002 | Hsu et al. | 257/777 |
| 6,486,415 B2 | * | 11/2002 | Jimarez et al. | 174/263 |
| 6,525,942 B2 | * | 2/2003 | Huang et al. | 361/704 |
| 6,528,882 B2 | * | 3/2003 | Ding et al. | 257/738 |
| 6,617,680 B2 | * | 9/2003 | Chien-Chih et al. | 257/698 |
| 6,784,554 B2 | * | 8/2004 | Kajiwara et al. | 257/778 |
| 6,854,636 B2 | * | 2/2005 | Farooq et al. | 228/180.22 |
| 6,889,429 B2 | * | 5/2005 | Celaya et al. | 29/840 |
| 2001/0025724 A1 | * | 10/2001 | Aizawa et al. | 174/266 |
| 2001/0050181 A1 | * | 12/2001 | Miura et al. | 174/256 |
| 2002/0011664 A1 | * | 1/2002 | Tanaka | 257/734 |
| 2002/0041489 A1 | * | 4/2002 | Fritz | 361/767 |
| 2002/0066949 A1 | * | 6/2002 | Ahn et al. | 257/684 |

(Continued)

*Primary Examiner*—Alexander Oscar Williams
(74) *Attorney, Agent, or Firm*—Kevin B. Jackson

(57) ABSTRACT

An integrated circuit package (60) has a substrate (12) with a first surface (51) for mounting a semiconductor die (20) and a second surface (52) defining a via (70). A lead (26) is formed by plating a conductive material to project outwardly from the second surface. The conductive material extends from the lead through the first via for coupling to the semiconductor die.

19 Claims, 3 Drawing Sheets

U.S. PATENT DOCUMENTS

2002/0163818 A1* 11/2002 Green et al. .................. 363/20
2002/0192443 A1* 12/2002 Sarkhel ...................... 428/209
2004/0238211 A1* 12/2004 Momokawa et al. ........ 174/260
2005/0073038 A1*  4/2005 Kuo et al. .................. 257/690
2005/0104219 A1*  5/2005 Matsui ....................... 257/774
2005/0106059 A1*  5/2005 Farooq et al. .............. 420/557
2006/0060959 A1*  3/2006 Hayashi et al. ............. 257/697

* cited by examiner

LEAD-FREE INTEGRATED CIRCUIT PACKAGE STRUCTURE

The present application is a divisional application based on prior U.S. application Ser. No. 09/817,330 filed on Mar. 26, 2001 now U.S. Pat. No. 6,889,429, which is hereby incorporated by reference, and priority thereto for common subject matter is hereby claimed.

BACKGROUND OF THE INVENTION

The present invention relates in general to semiconductor devices and, more particularly, to integrated circuits that include a grid array package for housing a semiconductor die.

Integrated circuits that have high pin or lead counts often are housed in grid array packages to achieve a small size. For example, ball grid array (BGA) packages are used to provide chip scale or nearly chip scale integrated circuits that have between eighty and three hundred leads. A BGA package includes an interposer or substrate whose top surface has a region for mounting a semiconductor die. Wire bonds electrically connect nodes of the semiconductor die to bonding pads formed on the top surface. Throughholes or vias through the substrate are used for connecting the bonding pads to access pads formed on the bottom surface of the substrate. The access pads typically are arranged in a grid to minimize the area occupied by the integrated circuit's leads. A Bolder mask is patterned with openings over each access pad to accommodate small solder balls which are reflowed to function as leads of the BGA. package.

Current BGA packages suffer from a high cost due to the complex equipment needed to pick up the small solder balls, place them on the access pads and then to reflow the solder without disturbing the solder ball positions. This equipment is expensive and occupies a large area of a manufacturing facility. The cost is further increased because the access pads must be made large enough to ensure that the solder mask openings do not overlap the boundaries of the access pads, thereby reducing the number of routing channels between access pads and increasing the size of the substrate. A further problem is the presence of lead in the solder balls, which is considered to be an environmental and health hazard.

Hence, there is a need for an integrated circuit grid array package and method which reduces the size and manufacturing cost of the package as well as the risk of environmental and health damage.

DETAILED DESCRIPTION OF THE DRAWINGS

In the figures, elements having the same reference numbers have similar functionality.

Figure 1:
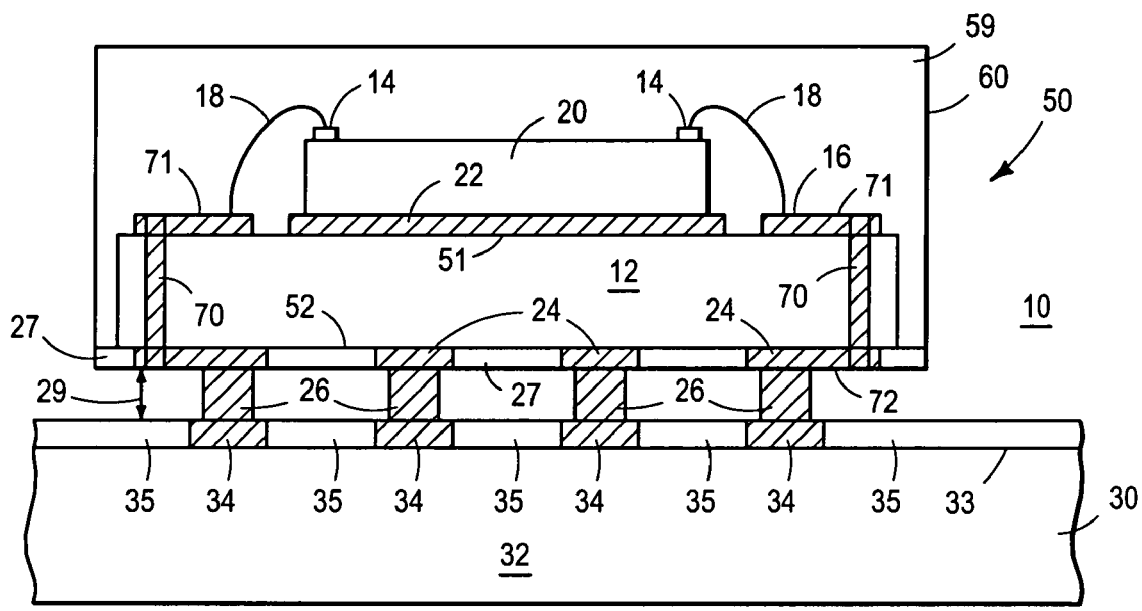
FIG. 1 is a cross-sectional view of an electrical system.

FIG. 1 is a cross-sectional view of an electrical system 10, including an integrated circuit 50 mounted to a motherboard 30. Integrated circuit 50 includes a semiconductor die 20 housed in an integrated circuit package 60.

Motherboard 30 comprises a standard printed circuit board consisting of a base 32 formed with glass epoxy or other dielectric material. Copper foil is laminated on a surface 33 of motherboard 30 and patterned to provide attachment pads 34 for securing leads 26 of package 60. Electrical and mechanical attachment of leads 26 is preferably accomplished with a lead-free solder which is reflowed after integrated circuit 50 is positioned on motherboard 30. Alternatively, a conductive material may be selectively plated on motherboard 30 to attach leads 26. A standard solder masking material is applied to surface 33 and patterned to form a solder mask 35 between attachment pads 34 to prevent a system malfunction due to solder bridging.

Package 60 comprises an interposer or substrate 12 formed with a dielectric material such as glass epoxy and/or bismaleimide-triazine (BT) resin. A copper foil formed to a typical thickness of about twenty-five micrometers is laminated on a first surface 51 of substrate 12 and patterned to form a die attach flag 22 as well as a plurality of bonding pads 16 and circuit interconnect traces 71. Die attach flag 22 is used for mounting semiconductor die 20 to substrate 12 with a thermally and/or electrically conductive epoxy or similar material. Bonding pads 16 are used for coupling electrical signals to die pads 14 of semiconductor die 20 with wire bonds 18. In an alternate embodiment, semiconductor die 12 may be mounted to substrate 12 in a flip-chip fashion. The foil laminated on surface 51 is described as comprising copper, but a suitable alternative conductive material may be used when appropriate. Package 60 includes a plastic molding compound 59 formed as shown to protect semiconductor die 20 from being damaged.

A copper foil formed to a thickness of about twenty-five micrometers is laminated on a surface 52 of substrate 12 and patterned to form a plurality of interconnect traces 72 and access pads 24. Integrated circuit 50 typically has between eighty and three hundred access pads 24 which are arrayed in a grid over surface 52 to minimize the area of package 60. Copper is plated on access pads 24 to project from surface 52 a typical distance of between fifty and one-hundred twenty five micrometers to form leads 26. Although the foil and leads 26 are described as comprising copper, another conductive material may be used in the alternative.

Openings are drilled in substrate 12 and copper plated to form vias 70 for coupling electrical signals between surface 51 and surface 52. A standard solder masking material is applied to surface 52 and patterned to form an insulating solder mask 27 as shown to provide damage protection and to prevent solder bridging when integrated circuit 50 is attached to motherboard 30.

Note that leads 26 are mounted to motherboard 30 so as to maintain a spacing 29 between surface 33 of motherboard 30 and surface 52 of substrate 12. Spacing 29 allows leads 26 to flex to absorb differences in the thermal expansion characteristics between motherboard 30 and integrated circuit 50. Such flexing improves the reliability of integrated circuit 50 by reducing the stress on semiconductor die 20. Flexing has an additional advantage of reducing shear stress where leads 26 and attachment pads 34 come into contact, thereby avoiding a circuit failure due to a detached lead. Similarly, flexing reduces the shear stress between leads 26 and access pads 24 to further improve reliability. As the length of leads 26 increases, the stress is reduced and reliability improves. Typically, leads 26 project from surface 52 a distance of between fifty and one hundred twenty-five micrometers to ensure that integrated circuit 50 has a low cost while meeting specified reliability levels.

Figure 2:
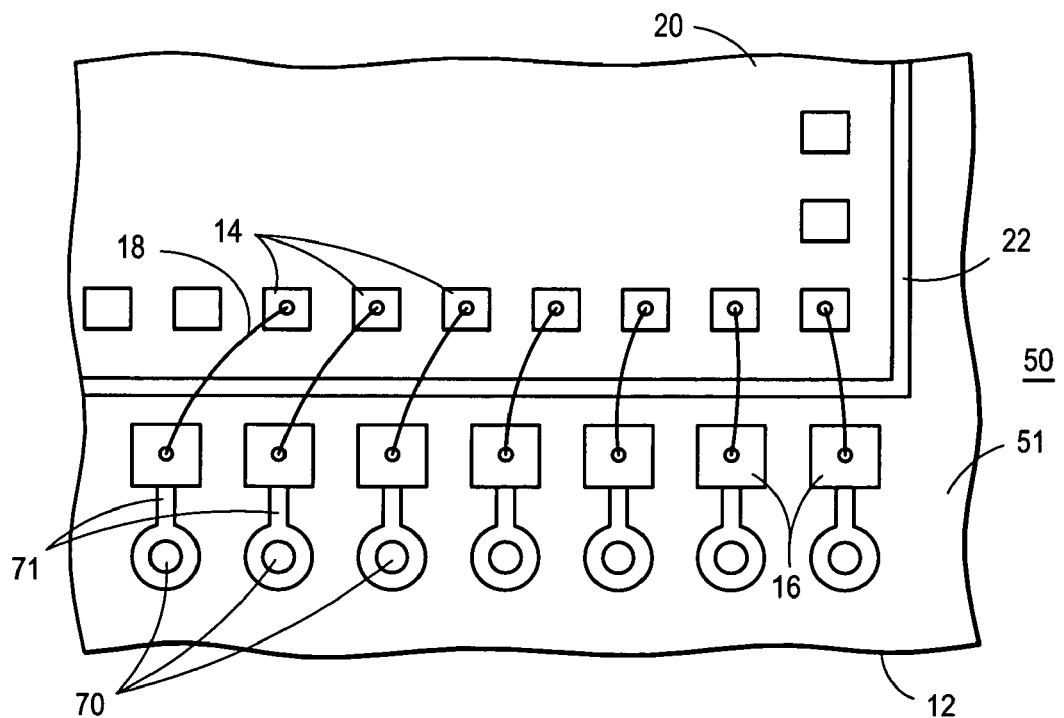
FIG. 2 is a top view of a first portion of an integrated circuit.

FIG. 2 is a top view of a first portion of integrated circuit 50, showing surface 51 of substrate 12 and semiconductor die 20 mounted on die attach flag 22. Die pads 14 typically are formed around the perimeter of semiconductor die 20 and coupled to bonding pads 16 with wire bonds 18 as shown. Substrate 12 is drilled to form throughholes or vias 70 whose sidewalls are copper plated to a thickness of about ten micrometers to provide electrical connections between surface 51 and surface 52 of substrate 12. Note that bonding pads 16 are formed to have a typical center-to-center spacing of about two hundred micrometers to facilitate wire bonding to die pads 14, which are formed with a typical center-to-center spacing of about one hundred fifty micrometers. The copper foil on surface 51 is further patterned to form traces 71 to extend bonding pads 16 to vias 70.

Figure 3:
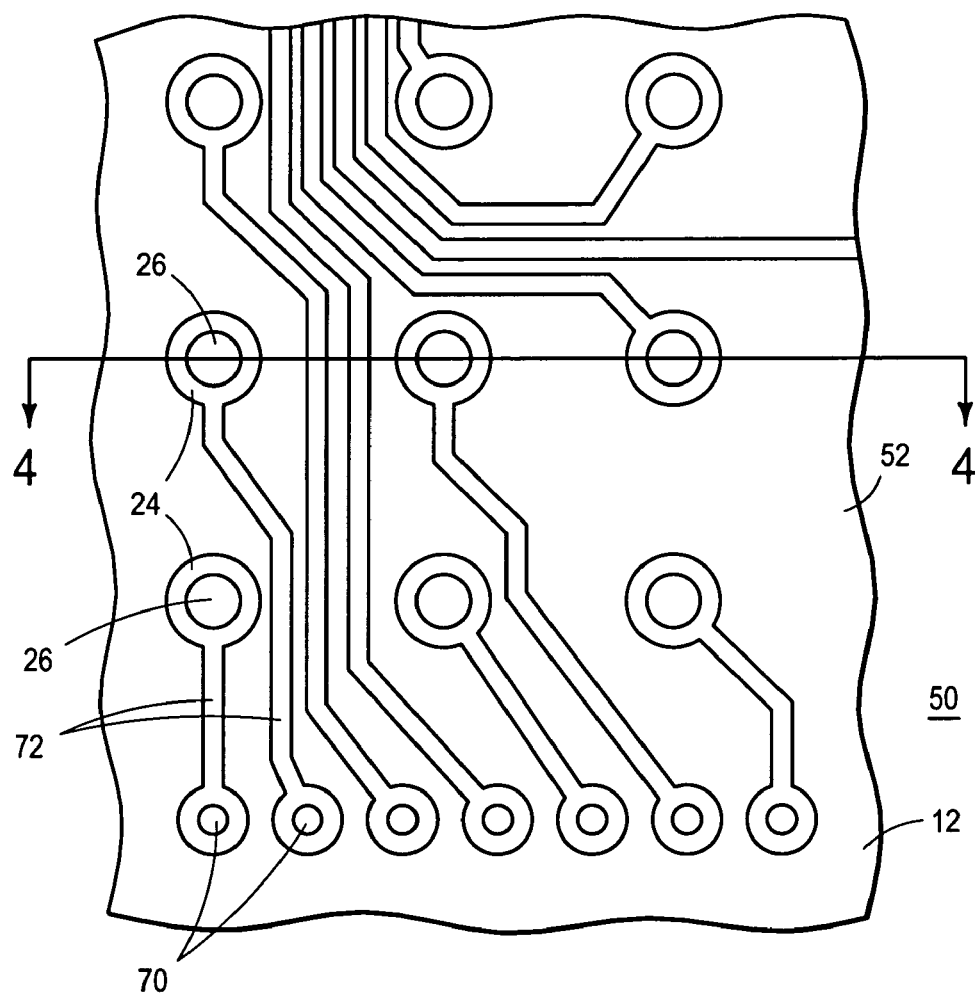
FIG. 3 is a bottom view of a second portion of the integrated circuit.

FIG. 3 is a bottom view of a second portion of integrated circuit 50, showing features formed on surface 52 in further detail. Vias 70 are extended through substrate 12 from surface 51. The copper foil laminated on surface 52 is patterned to form traces 72 which extend to provide signal paths from vias 70 to access pads 24 as shown. Leads 26 are formed by plating copper onto access pads 24 as described below.

Figure 4:
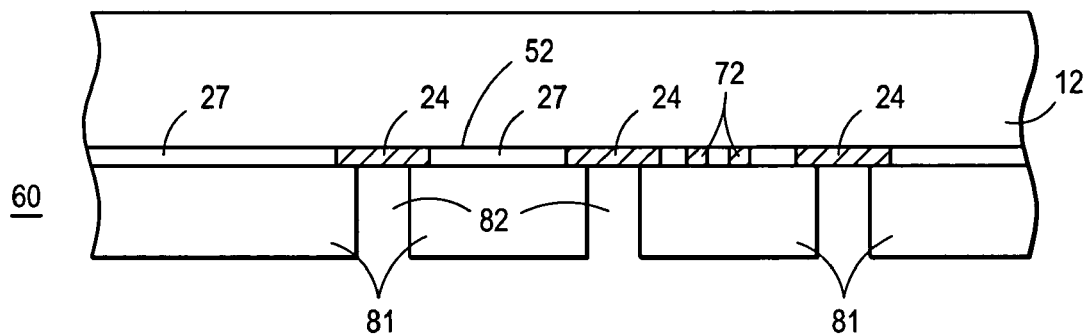
FIG. 4 is a cross-sectional view of a portion of an integrated circuit package after a first processing step.

FIG. 4 is a cross-sectional view of a portion of integrated circuit package 60 after a first processing step of the fabrication of leads 26. Substrate 12, access pads 24, traces 72 and solder mask 27 are formed as described above. A photoresist layer 81 is applied to cover surface 52 of substrate 12 and patterned to form openings 82 to expose access pads 24. Photoresist layer 81 is formed to a thickness determined by the desired height of leads 26. In one embodiment, photoresist layer 81 is formed to a thickness of about seventy five micrometers.

Figure 5:
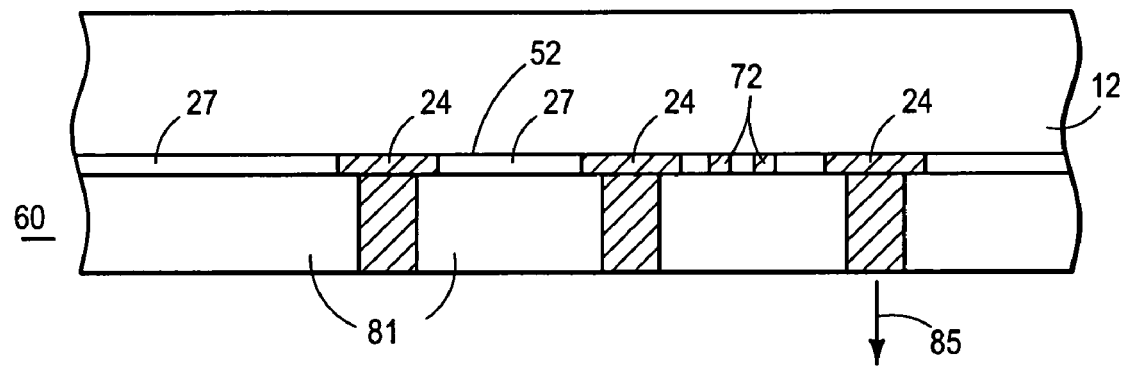
FIG. 5 is a cross-sectional view of the portion of the integrated circuit package after a second processing step.

FIG. 5 is a cross-sectional view of the portion of integrated circuit package 60 after a second processing step of the fabrication of leads 26. Package 60 is placed in a plating apparatus (not shown) to plate copper onto access pads 24 to fill openings 82 with plated copper. Copper is plated outwardly from surface 52 in a direction indicated by arrow 85. The plating step typically is a timed process whose duration is determined by the thickness of photoresist layer 81. In one embodiment, copper is electroplated in openings 82. In an alternative embodiment, electroless plating is used to deposit copper in openings 82. Although described as copper plating, a suitable alternate conductive material may be plated onto access pads 24.

Figure 6:
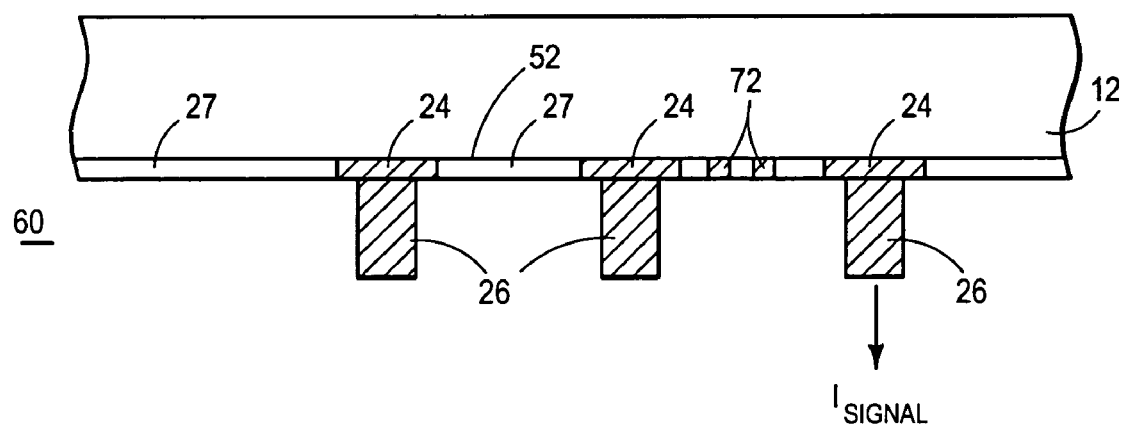
FIG. 6 is a cross-sectional view of the portion of the integrated circuit package after a third processing step.

FIG. 6 is a cross-sectional view of the portion of integrated circuit package 60 after a third processing step of the fabrication of leads 26. Photoresist layer 81 is removed using a standard removal process to leave leads 26 projecting outwardly from surface 52 as shown. In the described embodiment, leads 26 and access pads 24 are formed with the same conductive material, i.e., copper, so a secure mechanical interface as well as a low resistance connection between leads 26 and access pads 24 is obtained. In addition, plating produces a grain structure in leads 26 which results in a higher flexibility than would result from a more crystalline structure. The higher flexibility effectively provides a greater strain relief when motherboard 30 and package 60 expand at different rates as the temperature varies, which improves reliability. Moreover, plating provides a high degree of control over the height of leads 26, which results in a more uniform spacing between motherboard 30 and integrated circuit 50 than is achieved by using solder balls to form package leads. This uniformity improves reliability by ensuring that stress relief is more evenly distributed among leads 26 than is provided using solder ball leads.

Although access pads 24 are formed with copper foil while leads 26 are formed with plated copper, they have different structural characteristics. Plated copper is formed with grains which typically have a columnar structure whose grain boundaries run parallel to the direction of plating. That is the columnar grains of leads 25 run outwardly from surface 52 and parallel to the plating direction indicated by arrow 85 of FIG. 5. Such a structure produces a high shear strength in leads 26. Moreover, a signal current $I_{SIGNAL}$ flowing through one of the leads 26 in the plating direction encounters fewer grain boundaries than a current flowing perpendicular to the plating direction. Therefore, $I_{SIGNAL}$ flows through a lower electrical resistance.

Although solder mask 27 is shown as being formed before photoresist layer 81 is deposited and patterned, solder mask 27 may alternatively be formed after leads 26 are plated and photoresist layer 81 is removed. In this embodiment, leads 26 are protected with a screen template to avoid coating and a standard liquid solder masking material is flowed on surface 52 between leads 26. Such a process has an advantage of avoiding the need to use photoresist process to form solder mask 27, thereby reducing the manufacturing cost of integrated circuit 50.

In summary, the above described integrated circuit, package and method provide a higher reliability and lower cost than is achieved with previous grid array packages and methods. A substrate has a first surface for mounting a semiconductor die and a second surface defining a first via. A lead is formed with a conductive material to project outwardly from the second surface, where the conductive material extends from the lead through the first via for coupling to the semiconductor die. The leads are formed with a plating process to improve their flexibility and better control their height, which results in a high reliability. In addition, the use of copper leads has a further advantage of a lower thermal resistance than packages using solder ball leads, which lowers the die temperature to further improve reliability. Moreover, the invention eliminates the need for lead-based or other types of solder balls to form the leads, thereby reducing the cost of the package and the risk of health or environmental damage.

What is claimed is:

1. An integrated circuit package, comprising:
   a substrate having a first surface for mounting a semiconductor die and a second surface defining a via; and
   a lead-free lead formed with a conductive material to project outwardly from the second surface, where the conductive material is extended from the lead-free lead and through the via for coupling to the semiconductor die, and wherein the lead-free lead in non-spherical shape.

2. The integrated circuit package of claim 1, wherein the via is formed through the substrate to the first surface.

3. The integrated circuit package of claim 2, wherein the conductive material extends along the first surface to form a pad for electrically coupling to the semiconductor die.

4. The integrated circuit package of claim 1, wherein the conductive material is disposed along the second surface from the via to the lead.

5. The integrated circuit package of claim 1, wherein the conductive material includes copper.

6. The integrated circuit package of claim 5, wherein the conductive material includes plated copper.

7. The integrated circuit package of claim 1, wherein the lead-free lead projects from the second surface a distance of at least fifty micrometers.

8. The integrated circuit package of claim 1, wherein the substrate is formed with a dielectric material.

9. The integrated circuit of claim 8, wherein the dielectric material includes bismaleimide-triazine resin.

10. An integrated circuit, comprising:
    a semiconductor die;
    a substrate having first surface for mounting the semiconductor die and a second surface defining a via;
    a signal path formed with a first material that is disposed along the first surface and through the via to route a signal between the second surface and the semiconductor die; and
    a lead-free lead formed with the first material for coupling to the signal path, where the lead-free lead projects a distance from the second surface for receiving the signal, and wherein the lead-free lead comprises a nonspherical shape with a columnar grain structure.

11. The integrated circuit of claim 10, wherein the substrate is formed with a second material.

12. The integrated circuit of claim 11, wherein the first material comprises a conductive material and the second material comprises an insulator.

13. The integrated circuit of claim 10, wherein the signal path extends along the first surface to form a pad, further comprising a bonding wire for coupling the signal from the pad to the semiconductor die.

14. The integrated circuit of claim 10, wherein the signal path is routed along the second surface to form an access pad for disposing the lead.

15. The integrated circuit of claim 14, wherein the access pad is formed with a first thickness of the conductive material and the lead is formed with a second thickness of the conductive material.

16. The integrated circuit of claim 14, wherein the signal path is extended along the second surface and the lead is projected from a surface of the access pad.

17. The integrated circuit of claim 10, wherein the distance is from about fifty micrometers to about one hundred twenty-five micrometers.

18. The integrated circuit of claim 17, wherein the lead-free lead comprises plated copper.

19. The integrated circuit of claim 10 further including a solder mask formed on the second surface.

* * * * *